United States Patent
Lee et al.

(10) Patent No.: US 11,698,694 B2
(45) Date of Patent: Jul. 11, 2023

(54) DISPLAY APPARATUS REALIZING A LARGE IMAGE

(71) Applicant: LG Display Co., Ltd., Seoul (KR)

(72) Inventors: Yang Sik Lee, Seoul (KR); Sang Hyuck Bae, Seoul (KR); Hwi Deuk Lee, Gumi-si (KR); Min Jic Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/565,358

(22) Filed: Dec. 29, 2021

(65) Prior Publication Data

US 2022/0206621 A1 Jun. 30, 2022

(30) Foreign Application Priority Data

Dec. 31, 2020 (KR) .......... 10-2020-0189502

(51) Int. Cl.
*G06F 3/041* (2006.01)
*H10K 59/122* (2023.01)
*H10K 59/131* (2023.01)
*H10K 59/38* (2023.01)

(52) U.S. Cl.
CPC ......... *G06F 3/0412* (2013.01); *H10K 59/122* (2023.02); *H10K 59/131* (2023.02); *H10K 59/38* (2023.02)

(58) Field of Classification Search
CPC ..... G06F 3/041; G06F 3/0412; H01L 27/322; H01L 27/323; H01L 27/3246; H01L 27/3276; H10K 59/122; H10K 59/131
See application file for complete search history.

(56) References Cited

U.S. PATENT DOCUMENTS

| | | | |
|---|---|---|---|
| 7,271,409 B2 | 9/2007 | Young et al. | |
| 7,817,121 B2 | 10/2010 | Young et al. | |
| 11,315,986 B2 | 4/2022 | Kim et al. | |
| 2012/0205678 A1* | 8/2012 | Ikeda | H01L 51/5203 438/22 |
| 2016/0349899 A1 | 12/2016 | Hwang et al. | |
| 2018/0138247 A1 | 5/2018 | Lee et al. | |
| 2019/0157355 A1* | 5/2019 | Ye | H01L 27/3248 |
| 2020/0212116 A1 | 7/2020 | Kim et al. | |

FOREIGN PATENT DOCUMENTS

| | | | | |
|---|---|---|---|---|
| CN | 1643693 A | | 7/2005 | |
| CN | 111210732 A | * | 5/2020 | ........... G06F 3/0412 |
| CN | 111210732 A | | 5/2020 | |
| CN | 111384116 A | | 7/2020 | |
| KR | 10-2020-0082355 A | | 7/2020 | |
| TW | I702524 B | | 8/2020 | |
| WO | 2021/139660 A1 | | 7/2021 | |

* cited by examiner

*Primary Examiner* — Sardis F Azongha
(74) *Attorney, Agent, or Firm* — Seed IP Law Group LLP (57) ABSTRACT

A touch display apparatus for sensing a touch of a user and/or a tool is provided. The touch display apparatus includes upper electrodes on emission areas. The upper electrodes may be separated by a separating partition on a separating area and a second opening of a bank insulating layer. Each of the upper electrodes may be connected to one of link wires, which are disposed between a device substrate and the bank insulating layer. Thus, in the touch display apparatus, a process for sensing the touch of the user and/or the tool may be simplified, and a process efficiency may be improved.

22 Claims, 8 Drawing Sheets

DISPLAY APPARATUS REALIZING A LARGE IMAGE

This application claims the benefit of Korean Patent Application No. 10-2020-0189502 filed on Dec. 31, 2020, which is hereby incorporated by reference as if fully set forth herein.

BACKGROUND

Technical Field

The present disclosure relates to a touch display apparatus sensing a touch of a user and/or a tool.

Description of the Related Art

Generally, a display apparatus is provided to realize an image. For example, the display apparatus may include light-emitting devices. Each of the light-emitting devices may emit light displaying a specific color. For example, each of the light-emitting devices may include a light-emitting layer disposed between two electrodes.

The display apparatus may be a touch display apparatus which senses a touch of a user and/or a tool, and applies a specific signal. For example, the touch display apparatus may include touch electrodes which are disposed side by side on an encapsulating element covering the light-emitting devices. Each of the touch electrodes may be connected to the corresponding touch pad by one of touch links, which extend along a surface of the encapsulating element. Thus, in the touch display apparatus, a process may be complicated and a process efficiency may be decreased by forming the touch electrodes and the touch links.

BRIEF SUMMARY

Accordingly, the present disclosure is directed to a touch display apparatus that substantially obviates one or more problems due to limitations and disadvantages of the related art.

An advantage of the present disclosure is to provide a touch display apparatus capable of simplifying a process for sensing a touch of a user and/or a tool.

Another advantage of the present disclosure is to provide a touch display apparatus capable of minimizing or reducing additional process for electrodes sensing the touch of the user and/or the tool.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, there is provided a touch display apparatus comprising a device substrate. A link wire and an upper planarization layer are disposed on the device substrate. The upper planarization layer includes a link contact hole partially exposing the link wire. A bank insulating layer is disposed on the upper planarization layer. The bank insulating layer includes a first opening defining (e.g., in) an emission area and a second opening overlapping a portion of the link wire. A light-emitting device is disposed in the emission area. The light-emitting device includes a pixel electrode, a light-emitting layer and an upper electrode, which are sequentially stacked on the upper planarization layer. A separating partition is disposed on the bank insulating layer. A side of the separating partition overlapping with a side wall of the second opening has a shape of reverse taper. An encapsulating element is disposed on the bank insulating layer, the light-emitting device and the separating partition. The second opening is disposed between the first opening and the separating partition. The upper electrode of the light-emitting device includes an end which is disposed in the second opening. The end of the upper electrode is connected to the link wire.

An electrode pattern may be disposed on an upper surface of the separating partition opposite to the device substrate. The electrode pattern may include the same material as the upper electrode. The electrode pattern may be separated from the upper electrode.

A connecting electrode being in contact with the link wire may extend between the upper planarization and the bank insulating layer along a side wall of the link contact hole. The second opening may partially expose the connecting electrode. The end of the upper electrode may be in contact with a portion of the connecting electrode exposed by the second opening.

The connecting electrode may include the same material as the pixel electrode.

A first intermediate insulating layer may be disposed between the upper planarization layer and the bank insulating layer. A side of the first intermediate insulating layer toward the second opening between the link wire and the separating partition may have a shape of reverse taper.

The first intermediate insulating layer may have an etch selectivity to the bank insulating layer.

A second intermediate insulating layer may be disposed between the first intermediate insulating layer and the bank insulating layer. A side of the second intermediate insulating layer toward the second opening between the link wire and the separating partition may be disposed closer to the center of the second opening than the side of the first intermediate insulating layer toward the second opening.

The side of the second intermediate insulating layer toward the second opening between the link wire and the separating partition may have a shape of reverse taper.

The second intermediate insulating layer may have an etch selectivity to the bank insulating layer.

The second intermediate insulating layer may include the same material as the first intermediate insulating layer.

In another embodiment of the present disclosure, a touch display apparatus includes a device substrate. The device substrate includes an emission area and a separating area. A pixel electrode is disposed on the emission area of the device substrate. The pixel electrode is spaced away from the separating area. A link wire is disposed on the separating area of the device substrate. The link wire is spaced away from the pixel electrode. A bank insulating layer is disposed on the device substrate. The bank insulating layer includes a first opening partially exposing the pixel electrode and a second opening partially exposing the link wire. A light-emitting layer is disposed on a portion of the pixel electrode which is exposed by the first opening of the bank insulating layer. An upper electrode is disposed on the light-emitting layer. The upper electrode is connected to the link wire through the second opening. A separating partition is disposed on the bank insulating layer. The separating partition overlaps the separating area. A first intermediate insulating layer is disposed between the device substrate and the bank insulating layer. A side of the first intermediate insulating layer toward the second opening between the link wire and the separating partition has a shape of reverse taper. An encapsulating element is disposed between the upper electrode and the separating partition. The second opening is disposed between the emission area and the separating partition. The separating partition is disposed close to a side wall of the second opening. The side of the first intermediate insulating layer having a shape of reverse taper overlaps the link wire.

The side wall of the second opening may have an inclination angle larger than the side wall of the first opening.

An upper planarization layer may be disposed between the device substrate and the pixel electrode. The upper planarization layer may partially expose the link wire. The first intermediate insulating layer may be disposed between the device substrate and the upper planarization layer.

The first intermediate insulating layer may have an etch selectivity to the upper planarization layer.

A second intermediate insulating layer may be disposed between the first intermediate insulating layer and the upper planarization layer. A side of the second intermediate insulating layer overlapping with the link wire may have a shape of reverse taper.

In accordance with various embodiments, a method includes: forming a link wire over a device substrate; forming a bank insulating layer having a second opening and a first opening that is laterally offset from the second opening; and forming a light-emitting device. Forming the light-emitting device includes: forming a light-emitting layer on a pixel electrode, the pixel electrode being exposed by the first opening; and forming an upper electrode on the light-emitting layer. The upper electrode is electrically connected to the link wire through the second opening.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
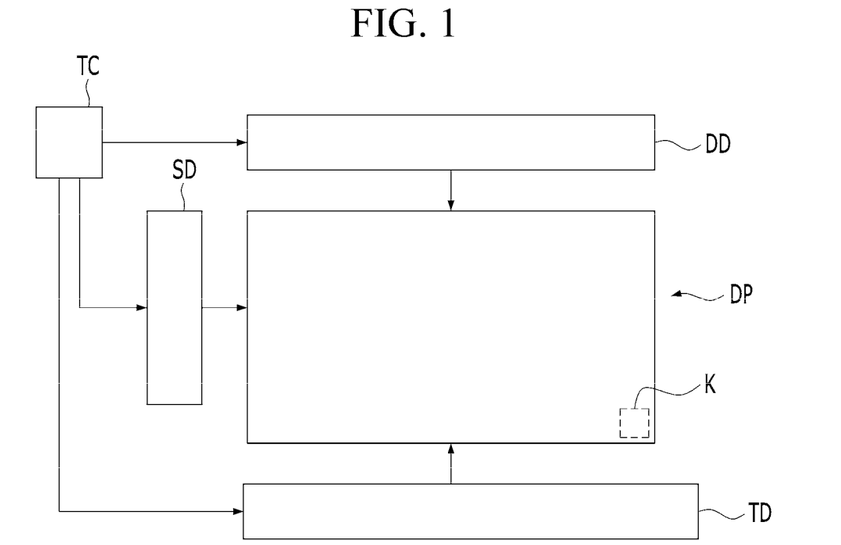
FIG. 1 is a view schematically showing a touch display apparatus according to an embodiment of the present disclosure.
Figure 2:
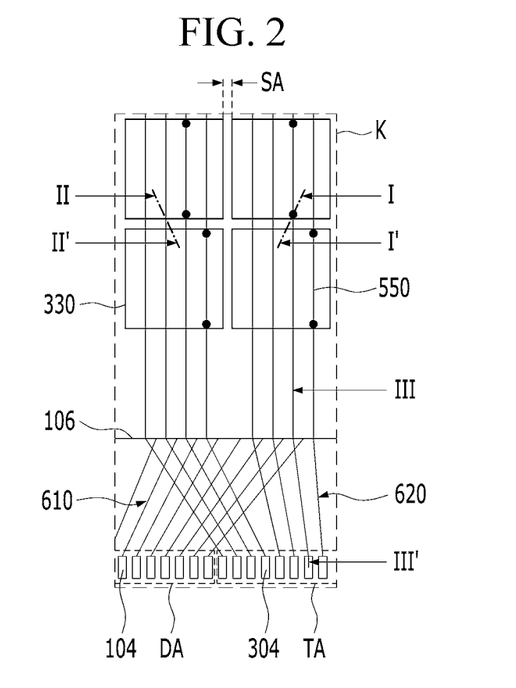
FIG. 2 is an enlarged view of K region in FIG. 1.
Figure 3A:
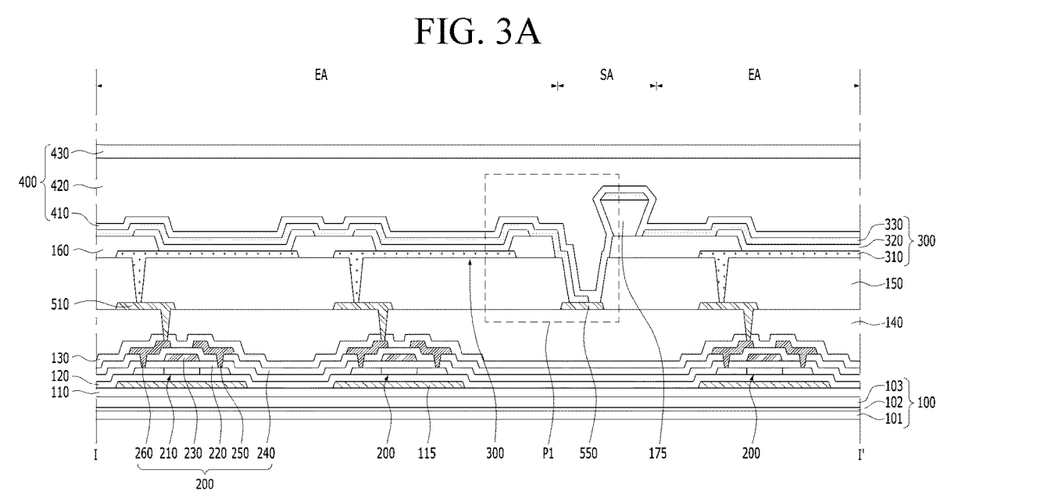
FIG. 3A is a view taken along I-I' of FIG. 2.
Figure 3B:
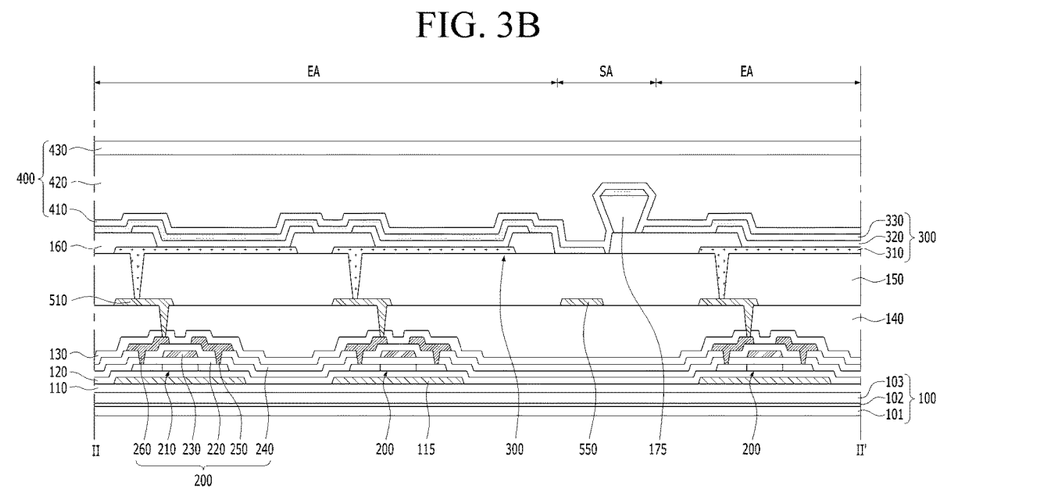
FIG. 3B is a view taken along II-II' of FIG. 2.
Figure 3C:
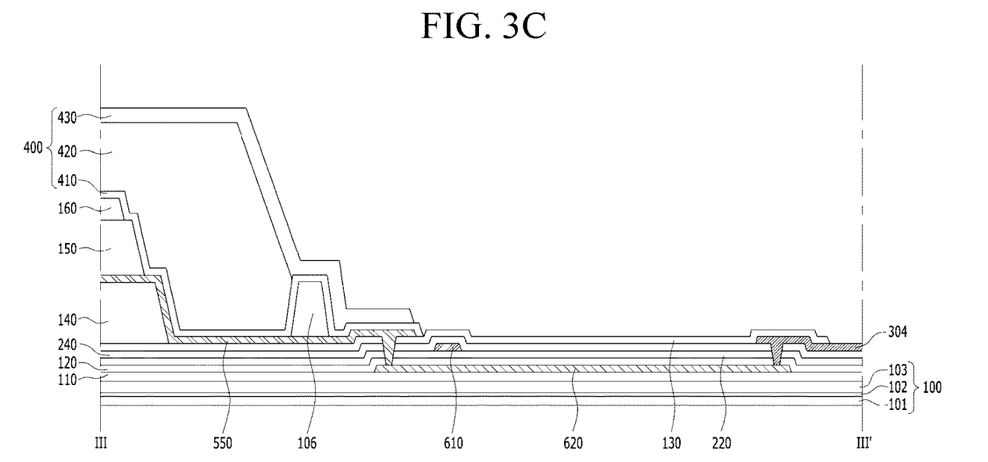
FIG. 3C is a view taken along III-III' of FIG. 2.
Figure 4:
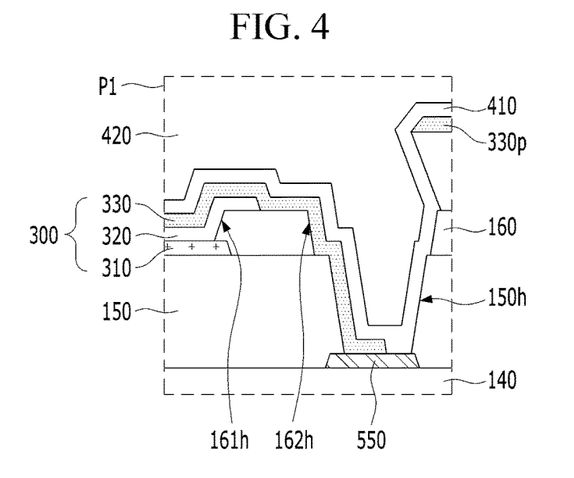
FIG. 4 is an enlarged view of P1 region in FIG. 3A.

FIG. 1 is a view schematically showing a touch display apparatus according to an embodiment of the present disclosure. FIG. 2 is an enlarged view of K region in FIG. 1. FIG. 3A is a view taken along I-I' of FIG. 2. FIG. 3B is a view taken along II-II' of FIG. 2. FIG. 3C is a view taken along III-III' of FIG. 2. FIG. 4 is an enlarged view of P1 region in FIG. 3A.

Referring to FIGS. 1 to 4, the touch display apparatus according to embodiment of the present disclosure may include a display panel DP and driving parts DD, SD, TD and TC. The driving parts DD, SD, TD and TC may provide various signals for realizing an image to the display panel DP. For example, the driving parts DD, SD, TD and TC may include a data driver DD applying a data signal, a scan driver SD applying a scan signal and a timing controller TC. The timing controller TC may apply a digital video data and a source timing control signal to the data driver DD, and apply clock signals, reverse clock signals and start signals to the scan driver SD. The driving parts DD, SD, TD, TC may be driving circuits, and may be referred to as the driving circuits DD, SD, TD, TC.

The display panel DP may generate an image provided to a user. For example, the display panel DP may include light-emitting devices 300 (see FIG. 3A) on a device substrate 100. The device substrate 100 may have a multi-layer structure. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substrate layer 103 may include a polymer material, such as poly-imide (PI). The substrate insulating layer 102 may include an insulating material. Thus, in the touch display apparatus according to the embodiment of the present disclosure, the device substrate 100 may have high flexibility. Therefore, in the touch display apparatus according to the embodiment of the present disclosure, the damage of the light-emitting devices 300 due to an external impact may be prevented.

Driving circuits may be disposed on the device substrate 100. Each of the driving circuits may be electrically connected to one of the light-emitting devices 300. Each of the driving circuits may be controlled by signals transmitted from the driving parts DD, SD, TD and TC. For example, each of the driving circuits may provide a driving current corresponding to the data signal to the corresponding light-emitting device 300 according to the scan signal. Each of the driving circuits may include at least one thin film transistor 200. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a lower resistance than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 within the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 within the drain contact hole.

A first buffer layer 110 may be disposed between the device substrate 100 and the driving circuits. The first buffer layer 110 may prevent pollution due to the device substrate 100 in a process of forming the thin film transistors 200. For example, the first buffer layer 110 may completely cover an upper surface of the device substrate 100 toward the light-emitting devices 300. The first buffer layer 110 may include an insulating material. For example, the first buffer layer 110 may include silicon oxide (SiO), silicon nitride (SiN), or both. The first buffer layer 110 may have a multi-layer structure.

A light-blocking pattern 115 may be disposed between the first buffer layer 110 and each thin film transistor 200. The light-blocking pattern 115 may prevent characteristics change of each thin film transistor 200 due to external light. For example, the light-blocking pattern 115 may include a portion overlapping with the semiconductor pattern 210 of each thin film transistor 200. The light-blocking pattern 115 may include a material that blocks or absorbs the light. For example, the light-blocking pattern 115 may include a metal, such as aluminum (Al), silver (Ag) and copper (Cu).

The light-blocking pattern 115 may be insulated from the semiconductor pattern 210 of each thin film transistor 200. For example, a second buffer layer 120 may be disposed between the light-blocking pattern 115 and the thin film transistors 200. The second buffer layer 120 may include an insulating material. For example, the second buffer layer 120 may include silicon oxide (SiO) or silicon nitride (SiN). The second buffer layer 120 may include the same material as the first buffer layer 110. The second buffer layer 12 may extend beyond the light-blocking pattern 115. For example, the second buffer layer 120 may be in direct contact with the first buffer layer 110 at the outside of the light-blocking pattern 115.

A lower passivation layer 130 may be disposed on the driving circuits. The lower passivation layer 130 may prevent the damage of the driving circuits due to the external impact and moisture. For example, an upper surface of each thin film transistor 200 opposite to the device substrate 100 may be covered by the lower passivation layer 130. The lower passivation layer 130 may include an insulating material. For example, the lower passivation layer 130 may include an inorganic insulating material, such as silicon oxide (SiO) and silicon nitride (SiN).

A lower planarization layer 140 and an upper planarization layer 150 may be sequentially stacked on the lower passivation layer 140. The lower planarization layer 140 and the upper planarization layer 150 may remove or reduce a thickness difference due to the driving circuits. For example, an upper surface of the upper planarization layer 150 toward the light-emitting devices 300 may be a flat surface. The lower planarization layer 140 and the upper planarization layer 150 may include an insulating material. For example, the lower planarization layer 140 and the upper planarization layer 150 may include organic insulating material. The upper planarization layer 150 may include a material different from the lower planarization layer 140. Thus, in the touch display apparatus according to the embodiment of the present disclosure, the thickness difference due to the driving circuits may be effectively removed or reduced.

The light-emitting devices 300 may be disposed on the upper planarization layer 150. Each of the light-emitting devices 300 may emit light displaying a specific color or selected color. For example, each of the light-emitting devices 300 may include a pixel electrode 310, a light-emitting layer 320 and an upper electrode 330, which are sequentially stacked on the upper planarization layer 150.

The pixel electrode 310 may include a conductive material. The pixel electrode 310 may have a high reflectance. For example, the pixel electrode 310 may include a metal, such as aluminum (Al) and silver (Ag). The pixel electrode 310 may have a multi-layer structure. For example, the pixel electrode 310 may have a structure in which a reflective electrode formed of a metal is disposed between transparent electrodes formed of a transparent conductive material, such as ITO and IZO.

The light-emitting layer 320 may generate light having luminance corresponding to a voltage difference between the pixel electrode 310 and the upper electrode 330. For example, the light-emitting layer 320 may include an emission material layer (EML) including an emission material. The emission material may include an organic material, an inorganic material or a hybrid material. For example, the touch display apparatus according to the embodiment of the present disclosure may be an organic light-emitting display apparatus including the emission material layer formed of an organic material. The light-emitting layer 320 may have a multi-layer structure. For example, the light-emitting layer 320 may include at least one of a hole injection layer (HIL), a hole transmitting layer (HTL), an electron transmitting layer (ETL) and an electron injection layer (EIL). Thus, in the touch display apparatus according to the embodiment of the present disclosure, the luminous efficiency of each light-emitting devices 300 may be increased.

The upper electrode 330 may include a conductive material. The upper electrode 330 may include a material different from the pixel electrode 310. The upper electrode 330 may have a higher transmittance than the pixel electrode 310. For example, the upper electrode 330 may be a transparent electrode formed of a transparent conductive material, such as ITO and IZO. Thus, in the touch display apparatus according to the embodiment of the present disclosure, the light generated from the light-emitting layer 320 may be emitted to the outside through the upper electrode 330.

A bank insulating layer 160 may be disposed on the upper planarization layer 150. The bank insulating layer 160 may include an insulating material. For example, the bank insulating layer 160 may include an organic insulating material. The bank insulating layer 160 may include a material different from the lower planarization layer 140 and the upper planarization layer 150. The bank insulating layer 160 may define (e.g., laterally surround) emission areas EA on the device substrate 100. For example, as illustrated in FIG. 4, the bank insulating layer 160 may include first openings 161h which are partially exposing the pixel electrode 310 of each light-emitting device 300. The light-emitting layer 320 and the upper electrode 330 of each light-emitting device 300 may be stacked on a portion of the corresponding pixel electrode 310 which is exposed by one of the first openings 161h of the bank insulating layer 160.

The pixel electrode 310 of each light-emitting device 300 may be electrically connected to one of the thin film transistors 200. Intermediate electrodes 510 may be disposed between the lower planarization layer 140 and the upper planarization layer 150. The intermediate electrodes 510 may include a conductive material. For example, the intermediate electrodes 510 may include a metal, such as aluminum (Al), titanium (Ti), copper (Cu), chrome (Cr), molybdenum (Mo) and tungsten (W). Each of the intermediate electrodes 510 may be electrically connected to the drain electrode 260 of one of the thin film transistors 200 by penetrating the lower planarization layer 140. For example, the pixel electrode 310 of each light-emitting device 300 may be connected to the corresponding thin film transistor 200 through the one of the intermediate electrodes 510. Each of the intermediate electrodes 510 may include a portion overlapping with the drain electrode 260 of one of the thin film transistors 200 and a portion overlapping with the pixel electrode 310 of one of the light-emitting devices 300. For example, the pixel electrode 310 of each light-emitting device 300 may be connected to the corresponding intermediate electrode 510 by penetrating the upper planarization layer 150.

The light emitted from each light-emitting device 300 may display a color different from the light emitted from adjacent light-emitting device 300. For example, the light-emitting layer 320 of each light-emitting device 300 may include a material different from the light-emitting layer 320 of adjacent light-emitting device 300. The light-emitting layer 320 of each light-emitting device 300 may be spaced away from the light-emitting layer 320 of adjacent light-emitting device 300. For example, the light-emitting layer 320 of each light-emitting device 300 may include an end which is disposed on the bank insulating layer 160.

A voltage applied to the upper electrode 330 of each light-emitting device 300 may be the same as a voltage applied to the upper electrode 330 of adjacent light-emitting device 300. For example, the upper electrode 330 of each light-emitting device 300 may be electrically connected to the upper electrode 330 of adjacent light-emitting device 300. The upper electrode 330 of each light-emitting device 300 may include the same material as the upper electrode 330 of adjacent light-emitting device 300. For example, the upper electrode 330 of each light-emitting device 300 may be formed simultaneously with the upper electrode 330 of adjacent light-emitting device 300.

The emission areas EA may be grouped by a separating area SA. For example, the separating area SA may have a lattice shape extended in a first direction and a second direction perpendicular to the first direction, and each of the emission areas EA may be disposed on a portion of the device substrate 100 which is surrounded by the separating area SA. A separating partition 175 may be disposed on the separating area SA. The separating partition 175 may include an insulating material. For example, the separating partition 175 may include an organic insulating material. The upper electrode 330 on each emission area EA may be blocked by the separating partition 175. For example, the upper electrode 330 on a portion of the device substrate 100 surrounded by the separating area SA may be separated by the separating partition 175 from the upper electrode 330 on another portion of the device substrate 100 surrounded by (e.g., on an opposite side of) the separating area SA. Thus, in the touch display apparatus according to the embodiment of the present disclosure, the upper electrodes 330 may be blocked (e.g., electrically isolated from each other) without additional patterning process. The upper electrodes 330 on the portions of the device substrate 100 which are surrounded by the separating area SA may be simultaneously formed. For example, an electrode pattern 330p (see FIG. 4) including the same material as the upper electrodes 330 may be disposed on an upper surface of the separating partition 175 opposite to the device substrate 100. The electrode pattern 330p may be spaced away from the upper electrodes 330. Therefore, in the touch display apparatus according to the embodiment of the present disclosure, the process efficiency may be improved. The described advantage of blocking upper electrodes 330 from each other without an additional patterning process may be achieved by presence of the separating partition 175 on the bank insulating layer 160 during formation (e.g., deposition) of the upper electrodes 330. Material of a layer forming the upper electrodes 330 may collect on exposed portions of the intermediate structure including the separating partition 175, without substantially collecting on vertical or reversed-tapered sidewalls of the intermediate structure. As such, the separating partition 175 allows a self-assembling patterned layer for forming the upper electrodes 330, which may obviate the need for additional patterning operations that would remove portions of the deposited layer to select the shape and electrical interconnection of the upper electrodes 330. The upper electrode 330 may be discontinuous between the link wire 550 and the separating partition 175, for example, due to the reverse taper of the separating partition 175.

The bank insulating layer 160 may include a second opening 162h (shown in FIG. 4) on the separating area SA. The separating partition 175 may be disposed close to (e.g., adjacent to) the second opening 162h of the bank insulating layer 160. For example, a side of the second opening 162h may overlap a side of the separating partition 175 having a shape of reverse taper or negative taper. Thus, in the touch display apparatus according to the embodiment of the present disclosure, the upper electrodes 330 may be more reliably separated by a thickness difference due to the second opening 162h. A side wall of the second opening 162h may have an inclination angle larger than a side wall of the first opening 161h. For example, bridging between the electrode pattern 330p and the upper electrode 330 shown in FIG. 4 is less likely to occur in the presence of collection of deposited material on intervening sidewalls between the electrode pattern 330p and the upper electrode 330.

Link wires 550 may be disposed between the lower planarization layer 140 and the upper planarization layer 150. The link wires 550 may include a conductive material. For example, the link wires 550 may include a metal, such as aluminum (Al), titanium (Ti), copper (Cu), chrome (Cr), molybdenum (Mo) and tungsten (W). The link wires 550 may include the same material as the intermediate electrodes 510. The link wires 550 may be insulated from the intermediate electrodes 510. The link wires 550 may extend in the first direction. For example, the link wires 550 may be spaced away from the intermediate electrodes 510 in the second direction.

Each of the link wires 550 may overlap a portion of the separating area SA, which extends in the second direction. Each of the upper electrodes 330 may be electrically connected to one of the link wires 550. For example, the upper planarization layer 150 may include link contact holes 150h (see FIG. 4) exposing a portion of each link wire 550. Each of the link contact holes 150h may overlap the second opening 162h of the bank insulating layer 160. For example, a side wall of each link contact hole 150h may overlap a side of the separating partition 175 which has a shape of reverse taper. For example, as shown in FIG. 4, a side of the link contact hole 150h (right side relative to the page) is vertically beneath and overlapped by the side of the separating partition 175 having the reverse taper (left side relative to the page). Each of the upper electrodes 330 may include an end which is connected to the corresponding link wire 550 in the second opening 162h. Thus, in the touch display apparatus according to the embodiment of the present disclosure, a signal applied to each upper electrode 330 may be different from a signal applied to adjacent upper electrode 330 (e.g., an upper electrode 330 on the opposite side of the separating partition 175). For example, in the touch display apparatus according to the embodiment of the present disclosure, the driving part DD, SD, TD and TC may include a touch sensing part TD to sense the touch of the user and/or the tool, and the link wires 550 may be selectively connected to the touch sensing part TD. That is, the touch display apparatus according to the embodiment of the present disclosure may apply the power voltage or a touch signal to the upper electrode 330 of each light-emitting device 300. Therefore, the touch display apparatus according to the embodiment of the present disclosure may sense the touch of the user and/or the tool by using the upper electrode 330 of each light-emitting device 300. For example, as shown in FIG. 2, the link wire 550 may be selectively connected to a display pad 104 or a touch pad 304 for passing the power voltage or the touch signal to the upper electrode 330, respectively.

An encapsulating element 400 may be disposed on the upper electrodes 330 and the separating partitions 175. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420 and the third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the touch display apparatus according to the embodiment of the present disclosure, the damage of the light-emitting devices 300 due to the external impact and moisture may be effectively prevented. A thickness difference due to the light-emitting devices 300 and the separating partitions 175 may be removed by the second encapsulating layer 420. For example, an upper surface of the encapsulating element 400 opposite to the device substrate 100 may be a flat surface. The side of each separating partition 175 having reverse taper may be covered by the encapsulating element 400. As shown in FIG. 3A, the first encapsulating layer 410 may be in contact with exposed sidewalls of the upper planarization layer 150, the bank insulating layer 160 and the separating partition 175, and with an exposed upper surface of the link wire 550. The first and second encapsulating layers 410, 420 may extend through the second opening 162h and into the link contact hole 150h, as shown in FIG. 4.

At least one encapsulating dam 106 may be disposed on the device substrate 100. The encapsulating dam 106 may block the flow of the second encapsulating layer 420 having a relatively high fluidity. For example, the second encapsulating layer 420 may be disposed on a portion of the device substrate 100 which is defined by (e.g., laterally surrounded by) the encapsulating dam 106. The first encapsulating layer 410 and the third encapsulating layer 430 may extend along a surface of the encapsulating dam 106. For example, the third encapsulating layer 430 may be in direct contact with the first encapsulating layer 410 at the outside of the encapsulating dam 106. The encapsulating dam 106 may include an insulating material. For example, the encapsulating dam 106 may include an organic insulating material. The encapsulating dam 106 may be disposed on the lower passivation layer 130. For example, the encapsulating dam 106 may include the same material as the lower planarization layer 140.

The display panel DP may be electrically connected to the driving parts DD, SD, TD and TC by pads 104 and 304, as illustrated in FIG. 2 and FIG. 3C. For example, a display pad area DA in which display pads 104 being electrically connected to each driving circuit are disposed, and a touch pad area TA in which touch pads 304 being electrically connected to the link wires 550 are disposed, may be disposed on a portion of the device substrate 100. Each of the display pads 104 may be connected to the corresponding driving circuit by one of first connecting links 610. Each of the touch pad 304 may be connected to the corresponding link wire 550 by one of second connecting links 620. The display pad area DA may be disposed side-by-side with the touch pad area TA. For example, each of the second connecting links 620 may cross at least one of the first connecting link 610. The second connecting links 620 may be insulated from the first connecting links 610. For example, the second connecting links 620 may be disposed on a layer different from the first connecting links 610, as shown in FIG. 3C. The first connecting links 610 and the second connecting links 620 may include the same material as one of conductive layers which are disposed between the device substrate 100 and the pixel electrodes 310. For example, the first connecting links 610 may include the same material as the gate electrode 230 of each thin film transistor 200, and the second connecting links 620 may include the same material as the light-blocking pattern 115. The first connecting links 610 may be disposed between the gate insulating layer 220 and the interlayer insulating layer 240. The second connecting link 620 may be disposed between the first buffer layer 110 and the second buffer layer 120. Each of the link wires 550 may be connected to the corresponding second connecting link 620 by penetrating the second buffer layer 120, the gate insulating layer 220, the interlayer insulating layer 240 and the lower passivation layer 130. The display pads 104 and the touch pads 304 may include a material different from the first connecting links 610 and the second connecting links 620. For example, the touch pads 304 may include the same material as the source electrode 250 and the drain electrode 260 of each thin film transistor 200. For example, the touch pads 304 may be disposed between the interlayer insulating layer 240 and the lower passivation layer 130. Each of the touch pads 304 may be connected to the corresponding second connecting link 620 by penetrating the second buffer layer 120, the gate insulating layer 220 and the interlayer insulating layer 240. The lower passivation layer 130 may partially expose each touch pad 304. The display pads 104 may include the same material as the touch pads 304.

Accordingly, the touch display apparatus according to the embodiment of the present disclosure may include the separating partition 175 on the separating area SA and the upper electrodes 330 separated by the separating partition 175, wherein each of the upper electrodes 330 may be connected to one of the link wires 550. Thus, the touch display apparatus according to the embodiment of the present disclosure may sense the touch of the use and/or the tool using the upper electrodes 330 which are separated by the separating partition 175. That is, in the touch display apparatus according to the embodiment of the present disclosure, a process of forming additional touch electrodes and touch links on the encapsulating element 400 which is disposed on the light-emitting devices 300 and the separating partition 175 may be omitted. Therefore, in the touch display apparatus according to the embodiment of the present disclosure, a process of forming a component for sensing the touch of the user and/or the tool may be simplified.

Also, in the touch display apparatus according to the embodiment of the present disclosure, the bank insulating layer 160 on the separating area SA may include the second opening 162h overlapping with the link wires 550, wherein the side wall of the second opening 162h may overlap the side of the separating partition 175 having a shape of reverse taper. Thus, in the touch display apparatus according to the embodiment of the present disclosure, the upper electrodes 330 may be effectively blocked (e.g., physically separated from others of the upper electrodes 330). Therefore, in the touch display apparatus according to the embodiment of the present disclosure, the process efficiency may be improved.

Figure 5:
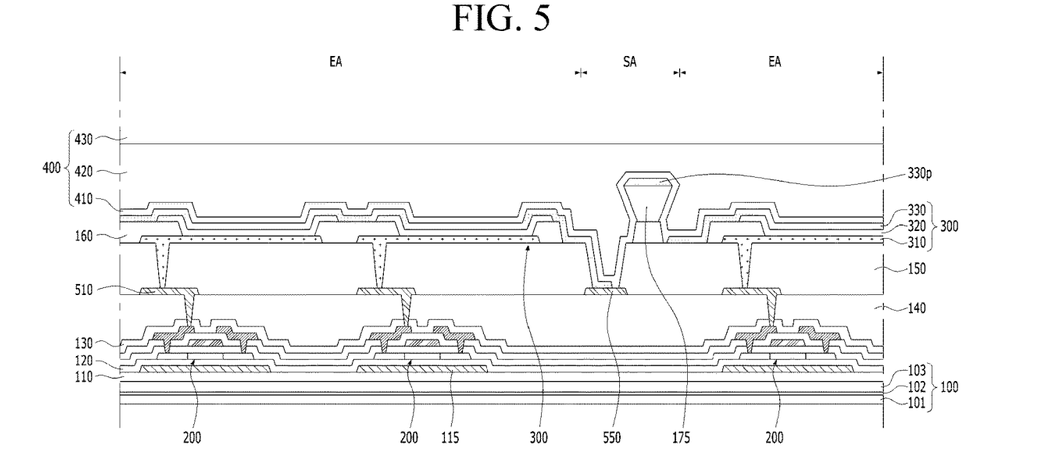
FIGS. 5 to 13 are views showing the touch display apparatus according another embodiment of the present disclosure.

The touch display apparatus according to the embodiment of the present disclosure is described that the second opening 162h of the bank insulating layer 160 overlaps the side of the separating partition 175. However, in the touch display apparatus according to another embodiment of the present disclosure, the bank insulating layer 160 located around the separating partition 175 in the separating area SA may be removed, as shown in FIG. 5. Thus, in the touch display apparatus according to another embodiment of the present disclosure, the separation of the upper electrodes 330 may be more effectively performed. Similar to described above with reference to FIG. 4, and now with reference to FIG. 5, increasing separation between the electrode pattern 330p and the upper electrode 330 (on the right side of the page) reduces opportunity for bridging between the electrode pattern 330p and the upper electrode 330 during deposition of the layer of the upper electrode 330.

Figure 6:
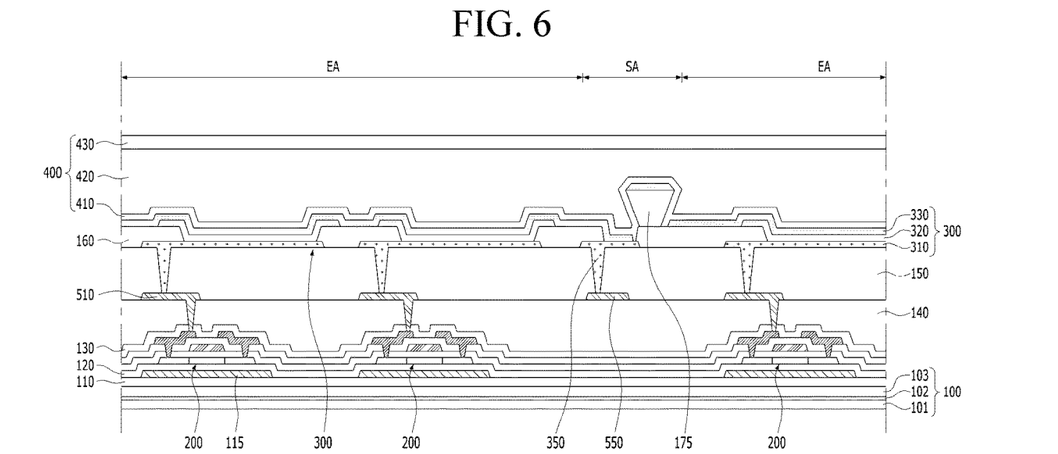

The touch display apparatus according to the embodiment of the present disclosure is described that the end of each upper electrode 330 is in direct contact with the corresponding link wire 550. However, in the touch display apparatus according to another embodiment of the present disclosure, each of the upper electrodes 330 may be electrically connected to the corresponding link wire 550 by one of connecting electrodes 350, as shown in FIG. 6. As such, the end of the upper electrode 330 may land on the connecting electrode 350, and may be separated from the upper surface of the link wire 550 by a distance equal to height of the connecting electrode 350. Each of the connecting electrode 350 may be connected to the corresponding link wire 550 by penetrating the upper planarization layer 150. The connecting electrodes 350 may extend between the upper planarization layer 150 and the bank insulating layer 160. For example, the second opening of the bank insulating layer 160 may expose a portion of each connecting electrode 350. The end of each upper electrode 330 may be in direct contact with a portion of the corresponding connecting electrode 350 which is exposed by the second opening. Thus, in the touch display apparatus according to another embodiment of the present disclosure, the separation of each upper electrode 330 due to a thickness of the upper planarization layer 150 and an inclination angle of a side wall of the link contact hole may be prevented. The connecting electrodes 350 may include a conductive material. For example, the connecting electrodes 350 may include a metal, such as aluminum (Al) and silver (Ag). The connecting electrodes 350 may include the same material as the pixel electrodes 310. For example, the connecting electrodes 350 may be simultaneously formed with the pixel electrodes 310. Therefore, in the touch display apparatus according to another embodiment of the present disclosure, the process efficiency may be effectively improved.

Figure 7:
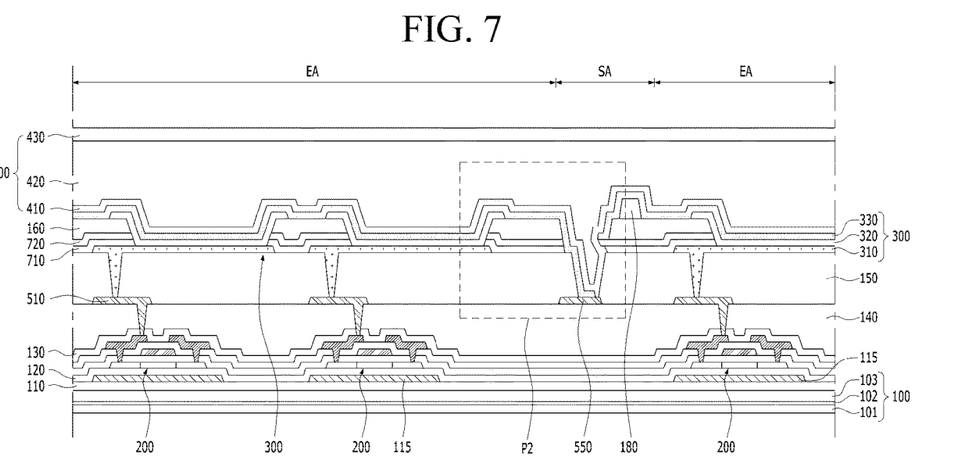
Figure 8:
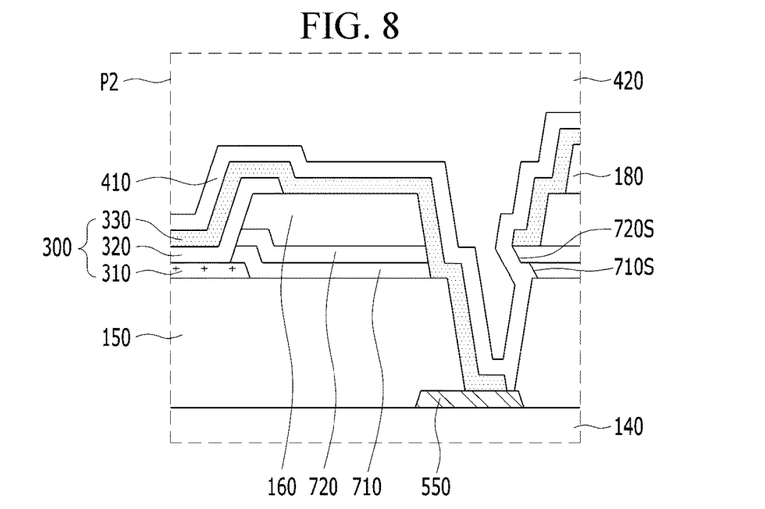

The touch display apparatus according to the embodiment of the present disclosure is described that the upper electrodes 330 are blocked by the side of the separating partition 175 having a shape of reverse taper and the second opening 162h of the bank insulating layer 160. However, in the touch display apparatus according to another embodiment of the present disclosure, the upper electrodes 330 may be separated by intermediate insulating layers 710 and 720 which are disposed between the upper planarization layer 150 and the bank insulating layer 160, and includes a side having a shape of reverse taper, as shown in FIGS. 7 and 8. The intermediate insulating layers 710 and 720 may include a side 710S and 720S, respectively, having a shape of reverse taper toward the second opening of the bank insulating layer 160 between the link wires 550 and a separating partition 180. The intermediate insulating layers 710 and 720 may have an etch selectivity to the bank insulating layer 160. For example, the intermediate insulating layers 710 and 720 may include an inorganic insulating material. The intermediate insulating layers 710 and 720 may have a multi-layer structure. For example, the intermediate insulating layers 710 and 720 may include a first intermediate insulating layer 710 and a second intermediate insulating layer 720 between the first intermediate insulating layer 710 and the bank insulating layer 160. The second intermediate insulating layer 720 may include the same material as the first intermediate insulating layer 710. Thus, in the touch display apparatus according to another embodiment of the present disclosure, the side of the separating partition 180 may have a shape of positive taper. Therefore, in the touch display apparatus according to another embodiment of the present disclosure, the degree of freedom for a shape of the separating partition 180 may be increased. For example, when material of the upper electrode 330 is deposited, the reverse taper of the sidewalls 710S, 720S prevents collection of material of the upper electrode 330 on the sidewalls 710S, 720S, such that the material of the upper electrode 330 on the upper surface of the second intermediate insulating layer 720 is physically separated, and electrically isolated, from the material of the upper electrode 330 on the upper surface of the link wire 550. In one embodiment, the sidewall 710S has the reverse taper, and the sidewall 720S has a positive taper, which is also effective to prevent bridging of the material of the upper electrode 330 during deposition thereof. The upper electrode 330 may be discontinuous between the link wire 550 and the separating partition 175, for example, due to the reverse taper of the sidewall 710S, the sidewall 720S, or both.

A side of the first intermediate insulating layer 710 and a side of the second intermediate insulating layer 720 which are toward the first openings of the bank insulating layer 160 may have a shape of positive taper. For example, the side of the first intermediate insulating layer 710 and the side of the second intermediate insulating layer 720 which are toward the emission area EA (e.g., the emission area EA on the left side of the page in FIG. 7) may have a shape of positive taper. Thus, in the touch display apparatus according to another embodiment of the present disclosure, the separation of the upper electrode 330 in each emission area EA may be prevented.

The side 720S of the second intermediate insulating layer 720 having a shape of reverse taper may be disposed closer to the center of the second opening than the side 710S of the intermediate insulating layer 710 having a shape of reverse taper. Thus, in the touch display apparatus according to another embodiment of the present disclosure, the under-cut region by the side 710S of the first intermediate insulating layer and the side 720S of the second intermediate insulating layer, which have a shape of reverse taper may be increased. Therefore, in the touch display apparatus according to another embodiment of the present disclosure, the separation of the upper electrodes 330 by the intermediate insulating layers 710 and 720 may be effectively performed.

Figure 9:
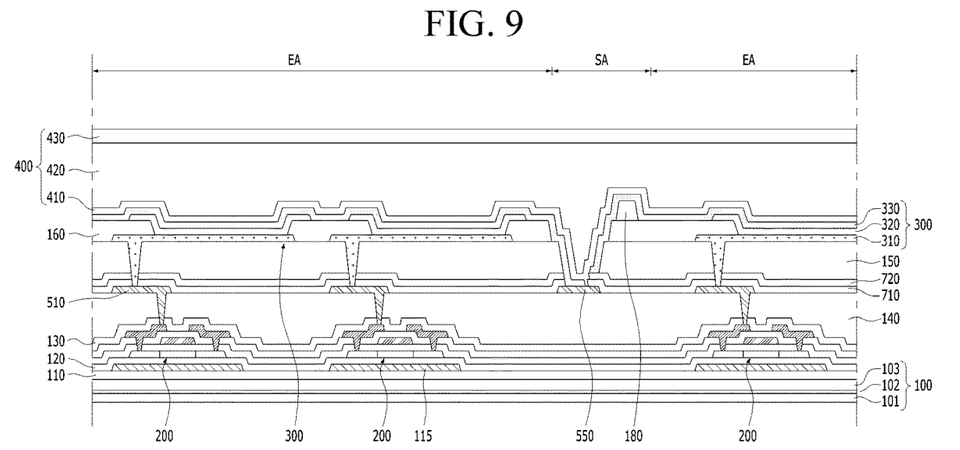

In the touch display apparatus according to another embodiment of the present disclosure, the first intermediate insulating layer 710 and the second intermediate insulating layer 720 may be stacked between the lower planarization layer 140 and the upper planarization layer 150, as shown in FIG. 9. A side of the first intermediate insulating layer 710 and a side of the second intermediate insulating layer 720 may have a shape of reverse taper. For example, the side of the first intermediate insulating layer 710 and the side of the second intermediate insulating layer 720 which are disposed between the link wires 550 and the separating partition 180 may have a shape of reverse taper. The first intermediate insulating layer 710 may have an etch selectivity to the upper planarization layer 150. The second intermediate insulating layer 720 may include the same material as the first intermediate insulating layer 710. For example, the first intermediate insulating layer 710 and the second intermediate insulating layer 720 may include an inorganic insulating material. The side of the first intermediate insulating layer 710 and the side of the second intermediate insulating layer 720 which have a shape of reverse taper may overlap the link wire 550. Thus, in the touch display apparatus according to another embodiment of the present disclosure, each of the upper electrodes 330 may be separated from the link wire 550. Therefore, in the touch display apparatus according to another embodiment of the present disclosure, a size of the separating area SA may be minimized or reduced.

Figure 10:
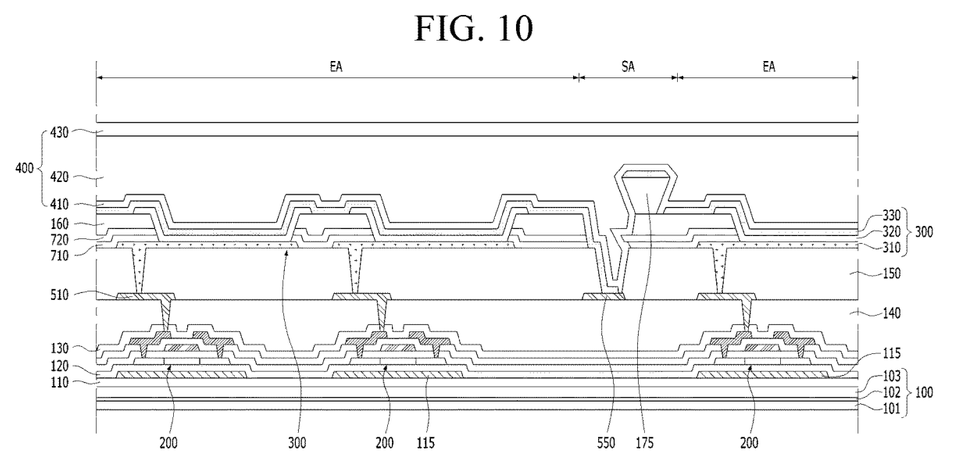

In the touch display apparatus according to another embodiment of the present disclosure, the side of the first intermediate insulating layer 710 and the side of the second intermediate insulating layer 720 which have a shape of reverse taper between the upper planarization layer 150 and the bank insulating layer 160 may overlap a side of the separating partition 175 having a shape of reverse taper, as shown in FIG. 10. Thus, in the touch display apparatus according to another embodiment of the present disclosure, each of the upper electrodes 330 may be reliably separated from adjacent upper electrode 330. Therefore, in the touch display apparatus according to another embodiment of the present disclosure, interference between the upper electrodes 330 which are separated may be prevented.

Figure 11:
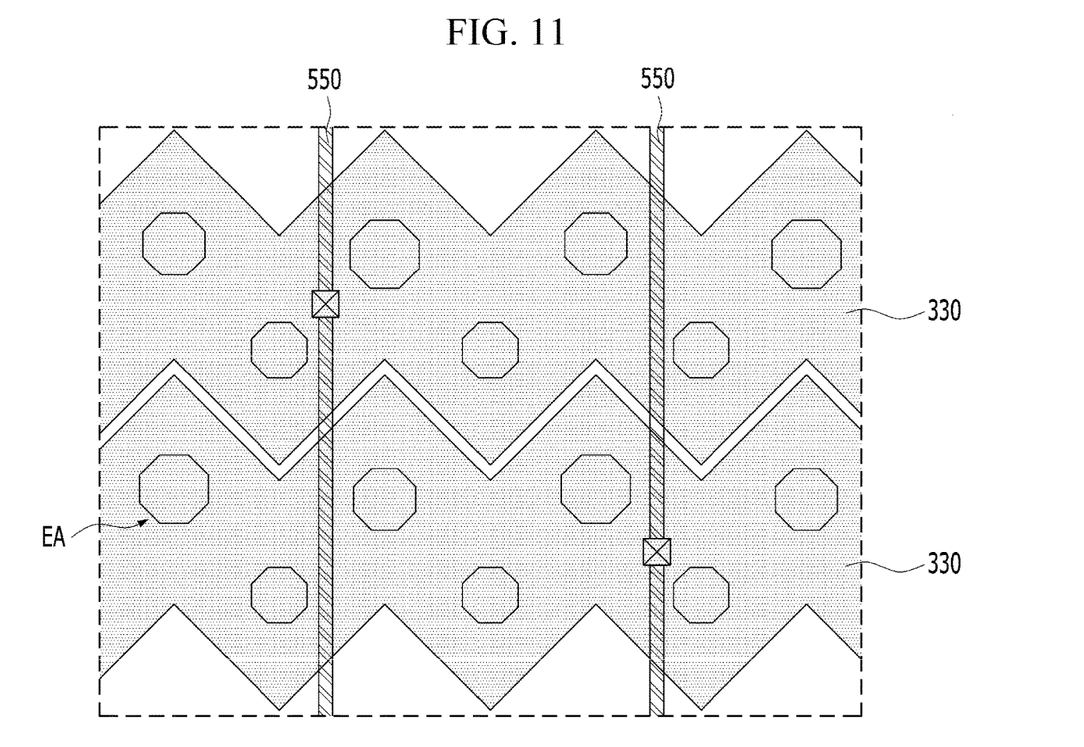

The touch display apparatus according to the embodiment of the present disclosure is described that the touch of the user and/or the tool is sensed by self-capacitance method using the upper electrodes 330 which are blocked by the separating area SA. However, the touch display apparatus according to another embodiment of the present disclosure may sense the touch of the user and/or the tool by mutual-capacitance method. For example, in the touch display apparatus according to another embodiment of the present disclosure, the upper electrodes 330 may be separated, so that the upper electrode 330 may extend in a direction perpendicular to the link wires 550, and each of the upper electrodes 330 may be connected to the link wire 550 different from adjacent upper electrode 330, as shown in FIG. 11. Thus, in the touch display apparatus according to another embodiment of the present disclosure, a touch driving signal Tx may be applied to one of the upper electrodes 330, and a touch sensing signal Rx may be applied to the upper electrode 330 which is disposed adjacent to the upper electrode 330 in which the touch driving signal Tx is applied. Therefore, in the touch display apparatus according to another embodiment of the present disclosure, the degree of freedom for touch driving method may be improved.

Figure 12:
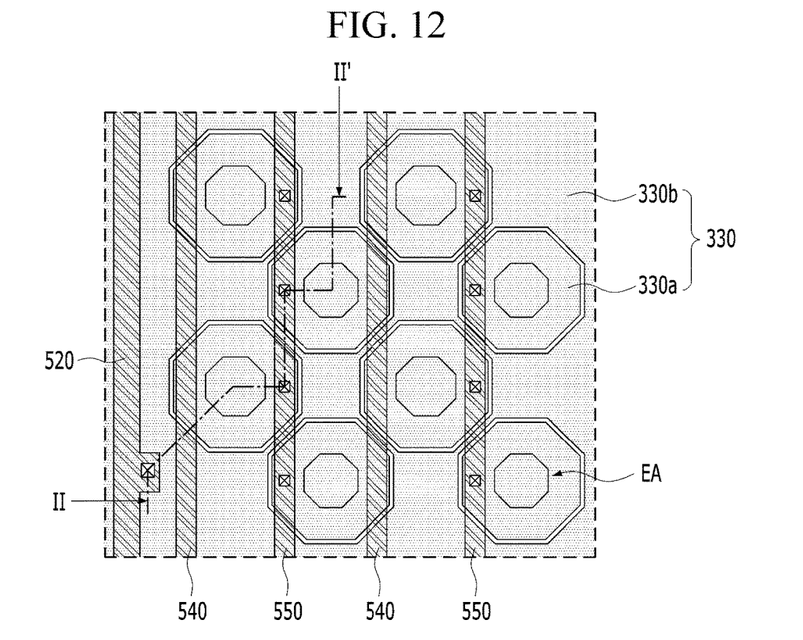
Figure 13:
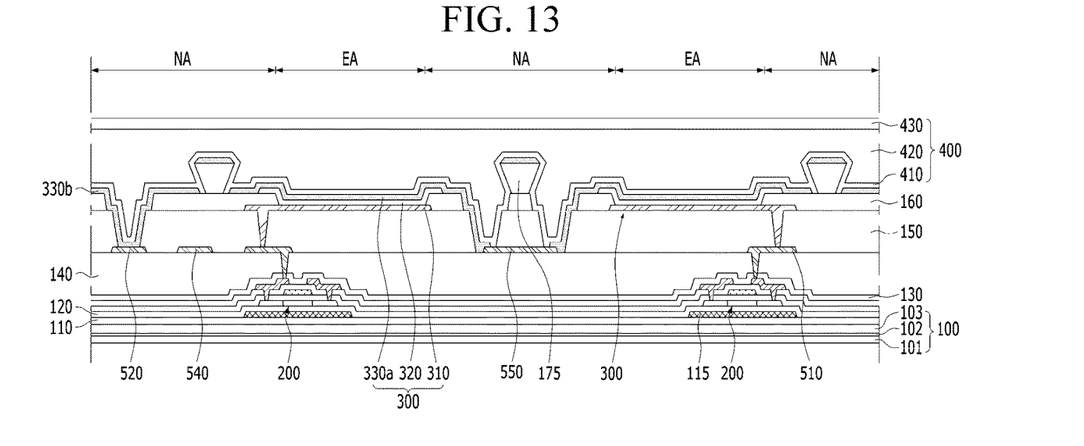

In the touch display apparatus according to another embodiment of the present disclosure, each of the upper electrodes 330 may be divided into first electrode regions 330a on the emission areas EA and a second electrode region 330b disposed outside the emission areas EA, as shown in FIGS. 12a and 13. Each of the first electrode regions 330a may be connected to one of first link wires 550, and the second electrode region 330b is connected to a second link wire 520. A signal applied to the first link wires 550 may be different from a signal applied to the second link wire 520. For example, the power voltage may be applied to the first link wires 550, and a touch signal may be applied to the second link wire 520. A signal wire 540 may be disposed between the first link wires 550 and the second link wire 520. Thus, in the touch display apparatus according to another embodiment of the present disclosure, realizing the image by the light-emitting devices 300 and sensing the touch of the user and/or the tool may be simultaneously performed. Therefore, in the touch display apparatus according to another embodiment of the present disclosure, the reliability of sensing touch may be improved.

In the result, the touch display apparatus according to the embodiments of the present disclosure may include the upper electrodes separated by the separating partition on the separating area and the second opening of the bank insulating layer, wherein each of the upper electrodes is connected to one of the link wires between the device substrate and the bank insulating layer. Thus, the touch display apparatus according to the embodiments of the present disclosure may sense the touch of the user and/or the tool by using the link wires and the upper electrodes, which are disposed between the device substrate and the encapsulating element. Thereby, in the touch display apparatus according to the embodiments of the present disclosure, the process of forming components for sensing the touch may be simplified, and the process efficiency may be improved.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display apparatus comprising:
   a link wire on a device substrate;
   an upper planarization layer on the device substrate, the upper planarization layer including a link contact hole partially exposing the link wire;
   a bank insulating layer on the upper planarization layer, the bank insulating layer including:
      a first opening in an emission area; and
      a second opening overlapping with a portion of the link wire;
   a first intermediate insulating layer between the upper planarization layer and the bank insulating layer, a side of the first intermediate insulating layer toward the second opening between the link wire and the separating partition having a shape of reverse taper;
   a light-emitting device in the emission area, the light-emitting device including a pixel electrode, a light-emitting layer and an upper electrode, which are sequentially stacked on the upper planarization layer;
   a separating partition on the bank insulating layer, the separating partition having a side that is reverse tapered and overlaps a side wall of the second opening; and
   an encapsulating element on the bank insulating layer, the light-emitting device and the separating partition,
   wherein the second opening is disposed between the first opening and the separating partition, and
   wherein the upper electrode of the light-emitting device includes an end which is disposed in the second opening, and is connected to the link wire.

2. The touch display apparatus according to claim 1, further comprising an electrode pattern on an upper surface of the separating partition, the upper surface being opposite to the device substrate, the electrode pattern being separated from the upper electrode,
  wherein the electrode pattern includes a same material as the upper electrode.

3. The touch display apparatus according to claim 1, further comprising a connecting electrode being in contact with the link wire, the connecting electrode extending between the upper planarization layer and the bank insulating layer along a side of the link contact hole,
  wherein the second opening partially exposes the connecting electrode, and
  wherein the end of the upper electrode is in contact with a portion of the connecting electrode which is exposed by the second opening.

4. The touch display apparatus according to claim 3, wherein the connecting electrode includes a same material as the pixel electrode.

5. The touch display apparatus according to claim 1, wherein the first intermediate insulating layer has an etch selectivity to the bank insulating layer.

6. The touch display apparatus according to claim 1, further comprising a second intermediate insulating layer between the first intermediate insulating layer and the bank insulating layer,
  wherein a side of the second intermediate insulating layer toward the second opening between the link wire and the separating partition is disposed closer to the center of the second opening than the side of the first intermediate insulating layer toward the second opening.

7. The touch display apparatus according to claim 6, wherein the side of the second intermediate insulating layer toward the second opening between the link wire and the separating partition has a shape of reverse taper.

8. The touch display apparatus according to claim 6, wherein the second intermediate insulating layer has an etch selectivity to the bank insulating layer.

9. The touch display apparatus according to claim 8, wherein the second intermediate insulating layer includes a same material as the first intermediate insulating layer.

10. The touch display apparatus according to claim 6, wherein a side of the first intermediate insulating layer and a side of the second intermediate insulating layer toward the first openings have a shape of positive taper.

11. The touch display apparatus according to claim 1, further comprising a second intermediate insulating layer stacked between the lower planarization layer and the upper planarization layer, wherein a side of the second intermediate insulating layer has a shape of reverse taper.

12. The touch display apparatus according to claim 1, wherein the upper electrode is divided into a first electrode region on the emission areas and a second electrode region disposed outside the emission areas, the first electrode region being connected to a first link wire of the link wire and the second electrode region being connected to a second link wire of the link wire, to which a signal different from a signal applied to the first link wire is applied.

13. The touch display apparatus according to claim 12, wherein a power voltage is applied to the first link wire, and a touch signal is applied to the second link wire.

14. The touch display apparatus according to claim 1, wherein a side wall of the second opening has an inclination angle larger than a side wall of the first opening.

15. A touch display apparatus comprising:
  a device substrate including an emission area and a separating area;
  a pixel electrode on the emission area of the device substrate, the pixel electrode being spaced away from the separating area;
  a link wire on the separating area of the device substrate, the link wire being spaced away from the pixel electrode;
  a bank insulating layer on the device substrate, the bank insulating layer including:
    a first opening partially exposing the pixel electrode; and
    a second opening partially exposing the link wire;
  a light-emitting layer on a portion of the pixel electrode which is exposed by the first opening;
  an upper electrode on the light-emitting layer, the upper electrode being connected to the link wire through the second opening;
  a separating partition on the bank insulating layer, the separating partition overlapping with the separating area;
  a first intermediate insulating layer between the device substrate and the bank insulating layer, the first intermediate insulating layer including a side toward the second opening between the link wire and the separating partition, the side having a shape of reverse taper; and
  an encapsulating element on the upper electrode and the separating partition,
  wherein the second opening is disposed between the emission area and the separating area,
  wherein the separating partition is disposed close to a side wall of the second opening, and
  wherein the side of the first intermediate insulating layer having the shape of reverse taper overlaps the link wire.

16. The touch display apparatus according to claim 15, wherein the side wall of the second opening has an inclination angle larger than the side wall of the first opening.

17. The touch display apparatus according to claim 15, further comprising an upper planarization layer between the device substrate and the pixel electrode, the upper planarization layer partially exposing the link wire,
  wherein the first intermediate insulating layer is disposed between the device substrate and the upper planarization layer.

18. The touch display apparatus according to claim 17, wherein the first intermediate insulating layer has an etch selectivity to the upper planarization layer.

19. The touch display apparatus according to claim 17, further comprising a second intermediate insulating layer between the first intermediate insulating layer and the upper planarization layer,
  wherein a side of the second intermediate insulating layer overlapping with the link wire has a shape of reverse taper.

20. A touch display apparatus, comprising:
  a first link wire on a device substrate;
  a second link wire on the device substrate, the second link wire being spaced away from the first link wire;
  an upper planarization layer on the device substrate, the upper planarization layer including a first link contact hole partially exposing the first link wire, and a second link contact hole partially exposing the second link wire;
  a bank insulating layer on the upper planarization layer, the bank insulating layer including:
    a first opening in an emission area;
    a second opening overlapping with a portion of the first link wire; and a third opening overlapping a portion of the second link wire, the first opening being disposed between the second opening and the third opening;

a light-emitting device in the emission area, the light-emitting device including a pixel electrode, a light-emitting layer and an upper electrode, which are sequentially stacked on the upper planarization layer;

a separating partition on the bank insulating layer, the separating partition having a side that is reverse tapered and overlaps a side wall of the second opening, the second opening being disposed between the first opening and the separating partition; and an encapsulating element on the bank insulating layer, the light-emitting device and the separating partition, wherein the upper electrode of the light-emitting device includes an end which is connected to the first link wire in the second opening.

21. The touch display apparatus of claim 20, further comprising a connecting electrode in contact with the pixel electrode, the connecting electrode being between the upper planarization layer and the device substrate.

22. The touch display apparatus of claim 21, wherein the connecting electrode has a lower transmittance than the upper electrode.

* * * * *